United States Patent
Tanaka et al.

(10) Patent No.: US 8,372,249 B2
(45) Date of Patent: Feb. 12, 2013

(54) PHOTOREDUCTION PROCESSING METHOD OF THREE-DIMENSIONAL METAL NANOSTRUCTURE

(75) Inventors: Takuo Tanaka, Wako (JP); Nobuyuki Takeyasu, Wako (JP); Satoshi Kawata, Wako (JP)

(73) Assignee: Riken, Wako-Shi, Saitama (JP)

( * ) Notice: Subject to any disclaimer, the term of this patent is extended or adjusted under 35 U.S.C. 154(b) by 0 days.

(21) Appl. No.: 13/413,852

(22) Filed: Mar. 7, 2012

(65) Prior Publication Data

US 2012/0160058 A1 Jun. 28, 2012

Related U.S. Application Data

(63) Continuation of application No. 12/410,641, filed on Mar. 25, 2009, now abandoned.

(30) Foreign Application Priority Data

Mar. 25, 2008 (JP) ................... 2008-077913

(51) Int. Cl.
*B01J 19/12* (2006.01)
*B22F 9/18* (2006.01)

(52) U.S. Cl. .................. 204/157.41; 204/157.4; 75/345; 977/783; 977/901

(58) Field of Classification Search ............... 204/157.4, 204/157.41; 75/345; 977/783, 901
See application file for complete search history.

(56) References Cited

U.S. PATENT DOCUMENTS

| | | | |
|---|---|---|---|
| 3,113,026 A | 12/1963 | Sprung | |
| 3,907,573 A * | 9/1975 | Franco et al. | ................. 430/628 |
| 6,627,048 B1 | 9/2003 | Shelnutt et al. | |
| 6,887,297 B2 | 5/2005 | Winter et al. | |
| 7,238,261 B2 | 7/2007 | Risen, Jr. et al. | |
| 7,252,699 B2 | 8/2007 | Perry et al. | |
| 8,246,714 B2 * | 8/2012 | Liu et al. | .................. 204/157.41 |
| 8,273,149 B2 * | 9/2012 | Shimotsuma et al. | .......... 75/345 |
| 2004/0079195 A1 | 4/2004 | Perry et al. | |
| 2006/0263541 A1 | 11/2006 | Tanaka et al. | |
| 2008/0085410 A1 | 4/2008 | Simone et al. | |

FOREIGN PATENT DOCUMENTS

JP 2006-316311 11/2006

OTHER PUBLICATIONS

Reetz et al, "Fabrication of Metallic and Bimetallic Nanostructures by Electron Beam Induced Metallization of Surfactant Stabilized Pd and Pd/Pt Clusters," J. Am. Chem. Soc. 1997, vol. 119, pp. 4539-4540.*
Zhang et al., "Syntheses and Characterizations of Two Novel Silver (I) Complexes Constructed by Oxydipropionitrile Ligand," Crystal Growth & Design 2005, vol. 5, No. 1, pp. 73-75.
Widoniak et al., "Silver Particles Tailoring of Shapes and Sizes," Colloids and Surfaces A, (2005), pp. 340-344.
Zhang et al., "Synthesis and Characterizations of Two Novel Silver (I) Complexes Constructed by Oxydipropionitrile Ligand," Crystal Growth & Design 2005, vol. 5, No. 1, pp. 73-75.

* cited by examiner

*Primary Examiner* — Keith Hendricks
*Assistant Examiner* — Colleen M. Raphael
(74) *Attorney, Agent, or Firm* — Nixon & Vanderhye P.C.

(57) ABSTRACT

In a method of producing a metal structure by photoreducing metal ion, a substance capable of suppressing growth of metal crystal is added to a medium in which metal ion is dispersed to prevent growth of the metal crystal produced by photoreduction of the metal ion, thereby processing resolution of a metal structure formed of the metal crystal is improved.

3 Claims, 5 Drawing Sheets

PHOTOREDUCTION PROCESSING METHOD OF THREE-DIMENSIONAL METAL NANOSTRUCTURE

This application is a continuation of U.S. patent application Ser. No. 12/410,641, filed Mar. 25, 2009, now pending, which claims priority to Japanese Patent No. 2008-077913, filed on Mar. 25, 2008, the entirety of both of which are incorporated by reference.

BACKGROUND OF THE INVENTION

1. Technical Field

The present invention relates to a method of producing a metal structure by photoreduction of metal ion. More specifically, the present invention relates to a method of manufacturing a metal structure, whereby processing resolution thereof is improved by suppressing growth of metal crystal constituting the metal structure.

2. Background Art

In recent years, fine processing technologies using light such as optical lithography technology and optical disk manufacturing technology are widely utilized, and such technologies have been studied in a variety of fields.

For example, the fine processing technology using light, which is most widely applied at present, is the above-mentioned optical lithography technology. The optical lithography technology is a backbone technology for manufacturing a variety of electronic devices such as semiconductor chips. The technology relates to a massive copying technology using a photo-transferring technology in principle, in which a metal in a specified region is dissolved, separated out, or removed finally in a chemical manner, thereby a desired metal pattern is formed as a metal structure. Therefore, this method may be used only for two-dimensional processing, and it is impossible to use the method to freely form a metal structure having a three-dimensional structure.

On the other hand, a technique for forming a metal pattern by irradiating directly a laser beam on a specified material is known as a technology for forming a desired metal pattern as a metal structure other than the above-mentioned optical lithography technology. More specifically, there are a technique involving irradiating a focused laser beam onto a medium having metal nanoparticles dispersed therein, to thereby melt and bind the metal nanoparticles at the focal point of the laser beam, thereby a metal pattern is formed as a metal structure; and a technique involving irradiating focused light onto metal ion, thereby the metal ion is photoreduced and a metal body is separated out, thereby a metal pattern is formed as a metal structure.

Here, in the above-mentioned technique involving separating out the metal body by photoreducing the metal ion, an arbitrary metal pattern can be formed as a metal structure in response to the track of scanned focused laser beam by scanning the focused laser beam which irradiates the material ion. Accordingly, a metal structure having a three-dimensional structure can be freely formed, and its applicable range is extremely wide, thereby studies and developments have been made upon the technique in a variety of fields in recent years.

A method of improving the processing resolution of the metal structure in the technique involving photoreducing the metal ion to separate out the metal body is also known.

In general, an absorption rate of light increases when metal structure is separated out, and hence there are many cases where the reaction proceeds explosively just at the moment when an increased amount of the metal structure exceeds a certain threshold value. There is a problem that, when such a phenomenon occurs, the photoreduction of the metal ions existing in the vicinity of the focal point proceeds at the same time, thereby the processing resolution of the metal structure degrades. In the method disclosed in JP2006-316311A, a specified pigment is added to a material, thereby an absorption spectrum and an absorption cross section of a non-processed material are maintained at constant, and the processing resolution is prevented from degradation by propagating energy of the laser beam to an area other than the focal point of the laser beam, besides photoreduction efficiency at the focal point of the laser beam is improved.

This method could improve the processing resolution to a micrometer order, but a higher-precision nanometer-order processing resolution was yet required.

SUMMARY OF INVENTION

An object of the present invention is to provide a method of producing a metal structure by photoreduction of metal ion, whereby processing resolution is significantly improved compared with conventional techniques. More specifically, an object of the present invention is to provide a method of producing a metal structure, whereby processing resolution thereof is improved by suppressing growth of metal crystal constituting the metal structure.

The inventors of the present invention have found that metal crystal produced by photoreduction continues to grow for a while even after light irradiation is stopped, and grows into a several micrometer size, and that such a phenomenon restricts the processing resolution of the metal structure produced by photoreduction of metal ion. Then, the inventors have made extensive studies, and as a result, they have found that a substance which can suppress growth of metal crystal when the substance is contained in a medium in which metal ion is dispersed, thereby completed the present invention.

That is, the present invention is as follows.

[1] A method of producing a metal structure composed of metal crystal, comprising a step of irradiating a medium containing metal ion dispersed therein with light, to thereby photoreduce the metal ion to produce metal crystal, wherein the medium contains a substance which blocks growth of the metal crystal.

[2] The method according to [1], wherein the substance has one or more functional groups selected from the group consisting of ionic functional groups and coordinating functional groups.

[3] The method according to [2], wherein the substance having the ionic functional group is represented by the general formula (I) or a salt thereof:

$$R^1\text{—COOH} \quad\quad\quad (I)$$

In the general formula (I), $R^1$ represents a saturated or unsaturated hydrocarbon group in which any hydrogen atom may be replaced by one or more substituents selected from the group consisting of carboxyl, amino, thiol, hydroxyl and cyano groups, and any —$CH_2$— may be replaced by —C(=O)— or —N($R^2$)—, and $R^2$ represents an alkyl group.

[4] The method according to [2], wherein the substance having the ionic functional group is represented by the general formula (II) or a salt thereof:

$$R^1\text{—}NH_2 \quad\quad\quad (II)$$

In the general formula (II), $R^1$ represents a saturated or unsaturated hydrocarbon group in which any hydrogen atom may be replaced by one or more substituents selected from the group consisting of carboxyl, amino, thiol, hydroxyl and cyano groups, and any —$CH_2$— may be replaced by —C(=O)— or —N($R^2$)—, and $R^2$ represents an alkyl group.

[5] The method according to [2], wherein the substance having the coordinating functional group is represented by the general formula (III) or a salt thereof:

$$R^1\text{—SH} \qquad (III)$$

In the general formula (III), $R^1$ represents a saturated or unsaturated hydrocarbon group in which any hydrogen atom may be replaced by one or more substituents selected from the group consisting of carboxyl, amino, thiol, hydroxyl and cyano groups, and any —$CH_2$— may be replaced by —C(=O)— or —N($R^2$)—, and $R^2$ represents an alkyl group.

[6] The method according to [2], wherein the substance having the coordinating functional group is represented by the general formula (IV) or a salt thereof:

$$R^1\text{—OH} \qquad (IV)$$

In the general formula (IV), $R^1$ represents a saturated or unsaturated hydrocarbon group in which any hydrogen atom may be replaced by one or more substituents selected from the group consisting of carboxyl, amino, thiol, hydroxyl and cyano groups, and any —$CH_2$— may be replaced by —C(=O)— or —N($R^2$)—, and $R^2$ represents an alkyl group.

[7] The method according to [2], wherein the substance having the coordinating functional group is represented by the general formula (V) or a salt thereof:

$$R^1\text{—CN} \qquad (V)$$

In the general formula (V), $R^1$ represents a saturated or unsaturated hydrocarbon group in which any hydrogen atom may be replaced by one or more substituents selected from the group consisting of carboxyl, amino, thiol, hydroxyl and cyano groups, and any —$CH_2$— may be replaced by —C(=O)— or —N($R^2$)—, and $R^2$ represents an alkyl group.

[8] The method according to [1], wherein the substance is represented by the general formula (VI) or a salt thereof:

$$R^1\text{—O—}R^3 \qquad (VI)$$

In the general formula (VI), $R^1$ and $R^3$ each represents a saturated or unsaturated hydrocarbon group in which any hydrogen atom may be replaced by one or more substituents selected from the group consisting of carboxyl, amino, thiol hydroxyl and cyano groups, and any —$CH_2$— may be replaced by —C(=O)— or —N($R^2$)—, and $R^2$ represents an alkyl group.

[9] The method according to [1], wherein the substance is represented by the general formula (VII) or a salt thereof:

$$R^1\text{—C(=O)—NH—}R^3 \qquad (VII)$$

In the general formula (VII), $R^1$ and $R^3$ each represents a saturated or unsaturated hydrocarbon group in which any hydrogen atom may be replaced by one or more substituents selected from the group consisting of carboxyl, amino, thiol, hydroxyl and cyano groups, and any —$CH_2$— may be replaced by —C(=O)— or —N($R^2$)—, and $R^2$ represents an alkyl group.

[10] The method according to [1], wherein the substance is a polymer or a copolymer composed of a monomer having one or more functional groups selected from the group consisting of amino, carboxyl, carbonyl and thiol groups.

[11] The method according to any one of [1], wherein the metal ion is a silver ion.

DESCRIPTION OF THE PREFERRED EMBODIMENTS

Hereinafter, embodiments of the present invention are described in detail.

In the present invention, the "metal structure" refers to a structure formed of metal crystals produced by photoreduction of metal ion. Therefore, as the size of each metal crystal becomes smaller, the processing resolution of the metal structure may be improved. The shape of the metal structure manufactured by the method of the present invention includes a one-dimensional structure such as a line or curve, a flat two-dimensional structure, and a spatial three-dimensional structure. According to the method of the present invention, a metal structure can be formed in an arbitrary pattern at any part in a medium. For example, it is easy to produce the metal structure on a part or whole of the surface of the medium or to form the metal structure at the inside thereof.

The light irradiated in the method of the present invention provides energy to reduce metal ion, therefore, the light to be irradiated has a wavelength at which the metal ion has an absorption. However, in the case where the medium contains a substance, which converts the wavelength of the irradiated light into the wavelength at which the metal ion has an absorption, the light to be irradiated is not limited to light having the wavelength at which the metal ion has an absorption.

Examples of the light source include laser light sources, light-emitting diodes, and lamps, and the laser light sources are preferably used because high energy is required to photoreduce the metal ion. Usually, the light to be irradiated is focused using a focus lens and focused in a medium in which metal ion is dispersed. Focusing of the light can increase the photon density at the focal point to a very high level, and may localize light energy necessary for reduction of the metal ion at the focal point. As a result, the metal ion can be photoreduced only in the vicinity of the focal point, and a fine metal structure can be manufactured along the track of the focal point by scanning the focal point. Moreover, the light may be focused to perform fine processing at a size scale of the focal point. In addition, femtosecond short pulse laser beam, or the like may be used to provide higher light energy per unit time.

The intensity of the irradiated light required for photoreducing metal ion depends on the type of the metal ion or the absorbance of the metal ion at the wavelength of the irradiated light. That is, in the case where the absorbance of the metal ion at the wavelength of the irradiated light is low, the intensity of the irradiated light required for photoreducing the metal ion is relatively high, while in the case where the absorbance of the metal ion at the wavelength of the irradiated light is high, the intensity of the irradiated light required for photoreducing the metal ion is relatively low. Meanwhile, in the case where the medium contains a substance which absorbs or scatters the irradiated light, the intensity of the irradiated light becomes smaller as the irradiated light passes through the medium. Therefore, it is necessary to relatively increase the intensity of the irradiated light. Thus, the intensity of the irradiated light necessary for photoreducing the metal ion may not be simply determined, but may be adjusted to a range of, for example, about 0.1 mW to 10 mW before incidence to the medium. It is not necessary to maintain the intensity of the irradiated light to a constant level during processing, and the intensity may appropriately be changed.

As well as the intensity of the irradiated light, the scan rate of the focal point may appropriately be adjusted depending on the absorbance of the metal ion at the wavelength of the irradiated light or the presence of a substance in the medium. Therefore, the scan rate necessary for photoreducing the metal ion may not be simply determined, but may be adjusted to a range of, for example, about 0.1 µm/s to 100 µm/s. It is not necessary to maintain the scan rate to a constant level during processing, and the rate may appropriately be changed.

Scanning of the focal point may be performed by, for example, irradiating light to a medium, in which metal ion is dispersed, and which is placed on a XYZ-axis stage, while the stage is moved one-dimensionally, two-dimensionally, and three-dimensionally. The focal point in the medium can be arbitrarily scanned by moving the stage. Also, the scanning of the focal point may also be performed by arbitrarily moving the position of the focal point in the medium, while the position of the medium, in which the metal ion is dispersed, is fixed. The medium in which the metal ion is dispersed and the focal point of the irradiated light can be moved simultaneously for scanning the focal point.

To manufacture a metal structure having a three-dimensional structure by scanning the focal point, it is preferred that metal crystals produced in advance do not block the track of the focal point. To achieve this, a metal structure could be manufactured by the sequential reductions of the metal ions by continuously scanning the focal point from a part, which is far from the incidence position of the irradiated light to the medium, to a part near to the incidence position. However, if the track of the focal point is not blocked, it is not necessary to scan the light from the farthest part to the nearest part. The focal point may be scanned in such a manner to manufacture a fine metal structure having an arbitrary three-dimensional structure, and to easily manufacture even a hollow metal structure such as a box. Meanwhile, in the case where the track of the focal point may be blocked by the metal crystals produced in advance, there may be employed a method involving: vanishing the irradiated light; appropriately changing the incidence angle of the irradiated light to the medium; and starting irradiation from a position not to block the track of the focal point to scan the focal point again.

In the present invention, as the metal ions to be photoreduced, the following are exemplified.
(1) Ions of transition elements from the IIIA group to IB group in the periodic table. Of those, Cr ion, Mn ion, Fe ion, Co ion, Ni ion, Pd ion, Pt ion, Cu ion, Ag ion, and Au ion are preferred.
(2) Ions of elements in the IIIB group. Of those, Al ion and In ion are preferred.
(3) Zn ion, Cd ion, Hg ion, Na ion, K ion, Mg ion, and Ca ion.

The state in which metal ion to be photoreduced is dispersed in a medium includes, for example, a state in which metal ion is dissolved in an aqueous medium and a state in which metal ion is dispersed in a medium such as an organic solvent or resin. The state in which metal ion is dispersed includes a state in which the ion is dispersed as a form of colloid or micelle.

In the present invention, the concentration of the metal ion dispersed in a medium is not particularly limited, and is preferably in the range of 0.001 M to 10 M. The concentration of the metal ion is more preferably in the range of 0.01 to 1M.

The medium which can be used in the present invention is not particularly limited as long as metal ion can be dispersed therein, and the medium includes: liquids or fluids such as water, organic solvents, and fats and oils; semisolids such as gel; and solids such as a resin (which is preferably a substance soluble in an organic solvent such as PMMA or PVA, or water), amorphous materials such as glass, inorganic crystals which may be doped with metal ion, such as lithium niobate, and the medium is preferably water. The medium in which metal ion is dispersed may be directly irradiated with light, or may be placed in a container or placed on a substrate and then irradiated with light through the container or substrate. In the case where the medium in which metal ion is dispersed is a liquid or fluid, light may be convergently irradiated on a contact surface between the container and the medium or between the substrate and the medium to form a metal structure on the inner surface of the container or on the substrate.

Figure 1:
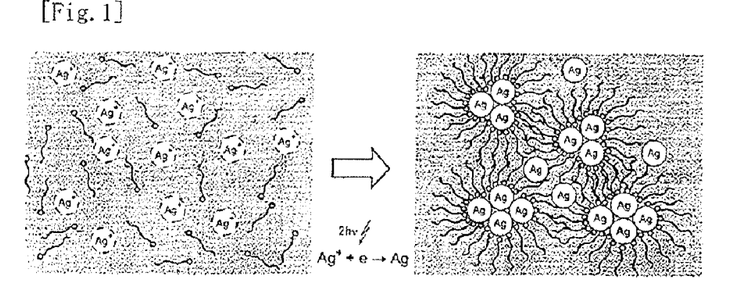
FIG. 1 is a drawing illustrating the action of a substance which blocks growth of a silver crystal.

In the present invention, the "substance which blocks growth of metal crystal" refers to a substance which prevents crystals formed by separating out of a metal from binding together and blocking the metal crystals from becoming larger. Examples of such a substance include a substance having an effect of covering the surface of metal crystal to prevent binding of the metal crystal to another metal crystal (FIG. 1). Based on this perspective, the substance which blocks growth of metal crystal preferably has all of the following properties.
(1) To have an atom which has affinity for or binds directly to a metal or metal ion in its molecule.
(2) To be dispersed in a solvent in which metal ion is dispersed.
(3) To have a low ability to directly reduce metal ion.
(4) To form no precipitates by binding to metal ion. However, if the precipitates can be dissolved again by pH adjustment of the solvent or by formation of complex ion of metal ion, such a substance may be used.

Of those substances, which are considered to satisfy the above-mentioned conditions, the substance which can be used in the present invention is a hydrocarbon chain further having at least one of the following properties.

(5) To have an ionic functional group in its molecular structure.
(6) To have a coordination linkage functional group having an unshared electron pair (lone pair) in its molecular structure.
(7) To have a peptide bond or a similar structure thereof, an ether bond, or an ester bond in its molecular structure.
(8) To have a carbonyl group in its molecular structure.

The above-mentioned hydrocarbon chain includes a saturated or unsaturated hydrocarbon chain and preferably includes a saturated hydrocarbon chain, because the saturated hydrocarbon has a lower ability to reduce metal ion.

The chain length of the hydrocarbon is not particularly limited and may appropriately be selected so that the hydrocarbon can be easily dispersed in a medium in consideration of the type of the medium to be used or the presence of a hydrophilic group in the molecular structure. In the case where water is used as a solvent and the molecular chain includes no hydrophilic group, the length of the carbon chain is preferably about 5 to 10.

The above-mentioned ionic functional group refers to a functional group which can be ionized in an aqueous solution and includes anionic and cationic functional groups. Examples of the anionic functional groups include carboxyl, sulfonyl, phosphate, and silanol groups and salts thereof; while examples of the cationic functional groups include amino and pyridinium groups and salts thereof. Among the salts of the ionic functional groups, the salts of the anionic functional groups include sodium and potassium salts; while the salts of the cationic functional groups include halogenated salts.

Examples of the above-mentioned coordination linkage functional groups include thiol, hydroxyl, and cyano groups. The thiol group can form a thiol bond together with gold, silver, copper, or the like.

A substance having the above-mentioned properties has affinity for a metal or binds directly to a metal atom, and hence the substance can coat the surface of the metal to prevent growth of metal crystal.

Substances represented by the following general formulae (I to VII) and salts thereof are included in the substance which blocks growth of metal crystal according to the present invention.

(I)

(II)

(III)

(IV)

(V)

(VI)

(VII)

In the formulae, $R^1$ and $R^3$ represent a saturated or unsaturated hydrocarbon group in which any hydrogen atom may be replaced by one or more substituents selected from the group consisting of carboxyl, amino, thiol, hydroxyl and cyano groups, and any $-CH_2-$ may be replaced by $-C(=O)-$ or $-N(R^2)-$, and $R^2$ represents an alkyl group.

The chain length of the alkyl group represented by $R^2$ is not particularly limited and may appropriately be selected in consideration of the type of a medium to be used and the presence of a hydrophilic group in the molecule structure. In the case where water is used as a solvent and the molecular chain includes no hydrophilic group, the length of the carbon chain is preferably about 5 to 10.

Examples of the salts of the substances represented by the above general formulae (I to VII) include substances having a sodium salt of a carboxyl group ($-COONa$), a potassium salt of a carboxyl group ($-COOK$), a calcium salt of a carboxyl group ($(-COO)_2Ca$), or a silver salt of a carboxyl group ($-COOAg$). In addition, the substances represented by the above general formulae (I to VII) or salts thereof include substances obtained by ionizing such substances, and the substance which blocks growth of metal crystal according to the present invention includes a substance having, for example, $-COO^-$ (produced by ionizing a carboxyl group or a salt thereof), $-NH_3^+$ (produced by ionizing an amino group), or $-SO_2^-$ (produced by ionizing a sulfonic group).

Specific examples of the substance represented by the above general formula (I) or the salts thereof include DL-alanine, decanoic acid, sodium decanoate, sebacic acid, disodium sebacate, lauric acid, sodium laurate, DL-2-amino-n-octanoic acid, sodium DL-2-amino-n-octanoate, N-decanoyl sarcosic acid, sodium N-decanoyl sarcosinate, N-lauroyl sarcosic acid, and sodium N-lauroyl sarcosinate.

Specific examples of the substance represented by the above general formula (II) and the salts thereof include amines such as 1-butyl amine and 1-hexyl amine.

Specific examples of the substance represented by the above general formula (III) and the salts thereof include thiols such as 1-butane thiol and 2-aminoethane thiol.

Specific examples of the substance represented by the above general formula (IV) and the salts thereof include some alcohols such as 6-amino-1-propanol and butanol.

Specific examples of the substance represented by the above general formula (V) and the salts thereof include butyronitorile.

Specific examples of the substance represented by the above general formula (VI) and the salts thereof include a substance having an ether bond such as 3,3'-oxydipropionitorile.

Specific examples of the substance represented by the above general formula (VII) and the salts thereof include peptides such as a dimer of alanine.

In addition, a polymer or copolymer formed of a monomer having one or more functional groups selected from amino, carboxyl, carbonyl, thiol, hydroxyl, and cyano groups is also included in the substance which blocks growth of metal crystal according to the present invention. Specific examples of the substance include poly(vinylpyrrolidone). The molecular weight of the polymer or copolymer is preferably about 40,000 to 80,000.

The concentration of the substance which blocks growth of metal crystal in a medium is not particularly limited and is preferably in the range of 0.001M to 10 M. The concentration is more preferably in the range of 0.01M to 1 M.

The temperature at which a metal structure is produced in the present invention is not particularly limited but is preferably in a temperature range in which the medium can maintain its original properties. For example, in the case where water is used as a medium, water freezes at a temperature below zero and evaporates at too high temperature. Therefore, it is impossible to maintain the original properties of water, and metal ion is reduced only at a high temperature, which is not preferable. In such case, the reaction temperature is preferably about 5 to 60° C., and usually, processing can be performed at room temperature. If optical energy is absorbed by metal ion, or the like, the energy is converted into heat, which may cause an increase in the temperature of the medium during processing. Therefore, if necessary, a cooling apparatus may be used to suppress an increase in the temperature.

EXAMPLES

Hereinafter, the present invention will be explained in more detail in examples described below. However, the scope of the present invention is not limited to the examples.

Example 1

Shape of Metal Structure Obtained by Adding a Substance which Blocks Growth of Metal Crystal to the Medium Sodium N-decanoyl sarcosinate (NDSS) (formula VIII) was added to an aqueous solution of silver nitrate, and the solution was dropped on a glass substrate (Micro Cover Glass, manufactured by Matsunami Glass Ind., Ltd.). Laser beam (light source: Titanium:sapphire femtosecond laser (Tsunami (registered trademark), manufactured by Spectra-Physics K.K.), center wavelength: 800 nm, pulse width: 80 fsec), which was controlled to be focused on the upper surface of the glass substrate, was irradiated from the bottom of the glass substrate and the focal point was scanned linearly in a horizontal direction to the surface of the substrate. The final concentration of NDSS was 0.1 M, the concentration of silver nitrate was 0.05 M, the strength of the irradiated laser beam was 0.8 mW, and the scan rate was 7 μm/s. Processing was performed at room temperature.

NDSS

Comparative Example

Shape of Metal Structure Obtained by Adding No Substance which Blocks Growth of Metal Crystal to the Medium A solution obtained by adding a solution of Coumarin 400 (manufactured by Exciton, purchased from Tokyo Instruments, Inc.) in 0.01 wt % ethanol to an aqueous solution of silver nitrate was dropped on a glass substrate (Micro Cover Glass, manufactured by Matsunami Glass Ind., Ltd.). Laser beam (light source: Titanium:sapphire femtosecond laser (Tsunami (registered trademark), manufactured by Spectra-Physics K.K.), center wavelength: 800 nm, pulse width: 80 fsec), which was controlled to be focused on the upper surface of the glass substrate, was irradiated from the bottom of the glass substrate, and the focal point was scanned linearly in a horizontal direction to the surface of the substrate. The concentration of silver nitrate was 0.05 M, the strength of the irradiated laser beam was 0.8 mW, and the scan rate was 7 μm/s. Processing was performed at room temperature.

Figure 2:
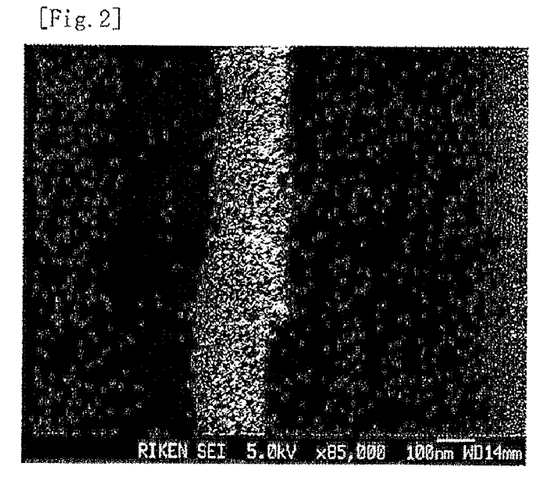
FIG. 2 is an electron micrograph of a silver line obtained by adding NDSS as the substance which blocks growth of metal crystal to a medium.
Figure 3:
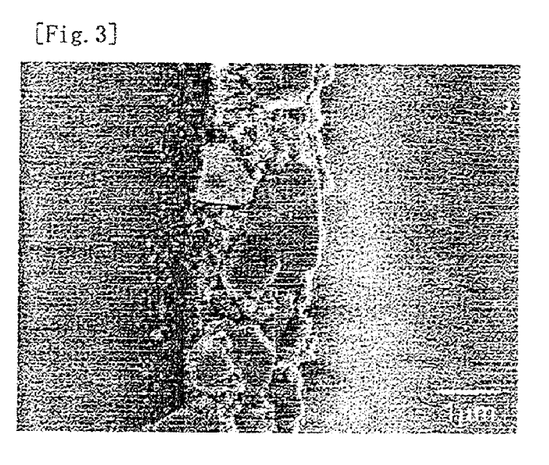
FIG. 3 is an electron micrograph of a silver line obtained by adding no substance which blocks growth of metal crystal to a medium.
Figure 4:
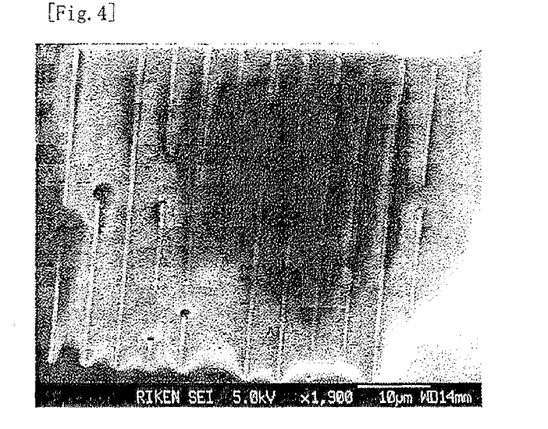
FIG. 4 is an electron micrograph of silver lines obtained by adding DL-alanine as the substance which blocks growth of metal crystal to a medium.
Figure 5:
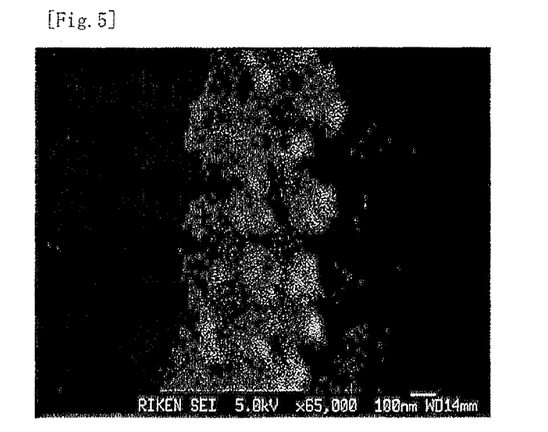
FIG. 5 is an electron micrograph of a silver line obtained by adding DL-alanine as the substance which blocks growth of metal crystal to a medium (enlarged micrograph of FIG. 4).
Figure 6:
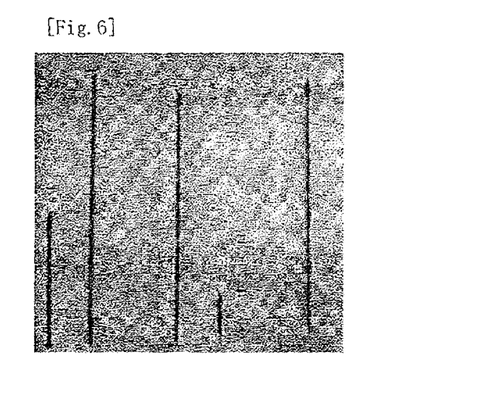
FIG. 6 is an electron micrograph of silver lines obtained by adding sodium decanoate as the substance which blocks growth of metal crystal to a medium.
Figure 7:
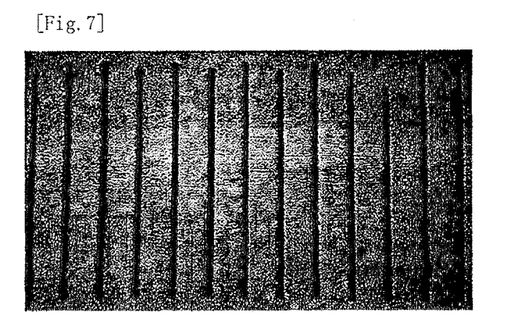
FIG. 7 is an electron micrograph of silver lines obtained by adding disodium sebacate as the substance which blocks growth of metal crystal to a medium.
Figure 8:
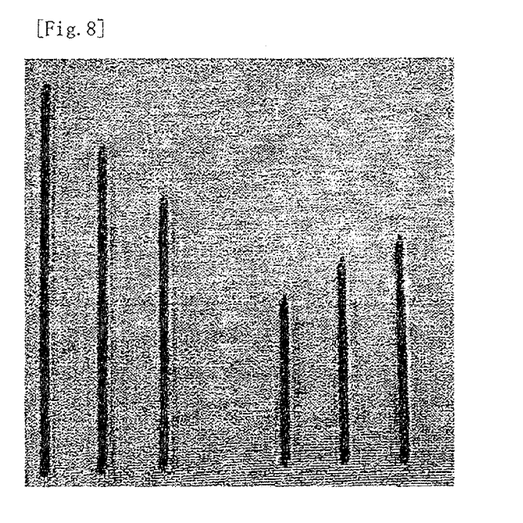
FIG. 8 is an electron micrograph of silver lines obtained by adding sodium laurate as the substance which blocks growth of metal crystal to a medium.
Figure 9:
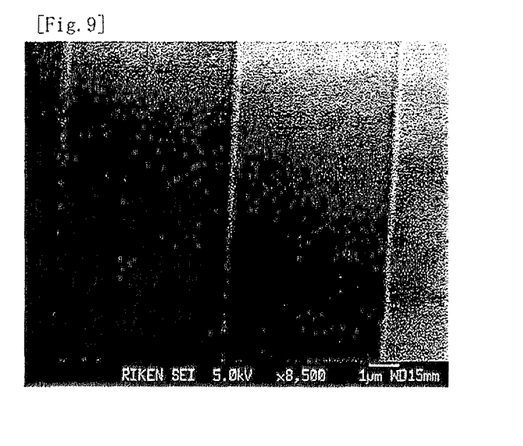
FIG. 9 is an electron micrograph of silver lines obtained by adding DL-2-amino-n-octanoic acid as the substance which blocks growth of metal crystal to a medium.
Figure 10:
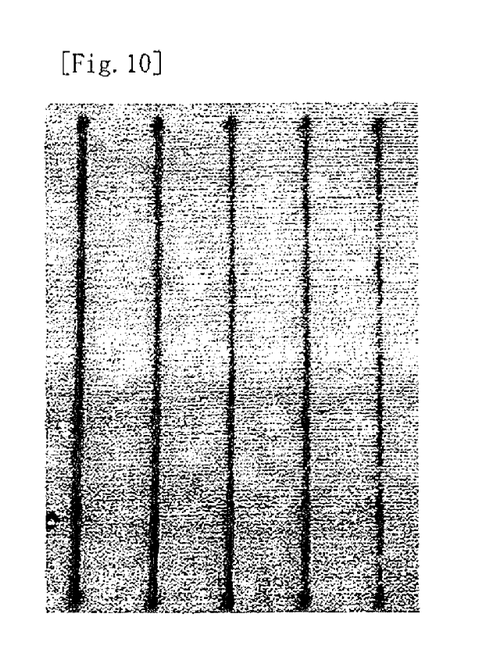
FIG. 10 is an electron micrograph of silver lines obtained by adding sodium N-lauroyl sarcosinate hydrate as the substance which blocks growth of metal crystal to a medium.
Figure 11:
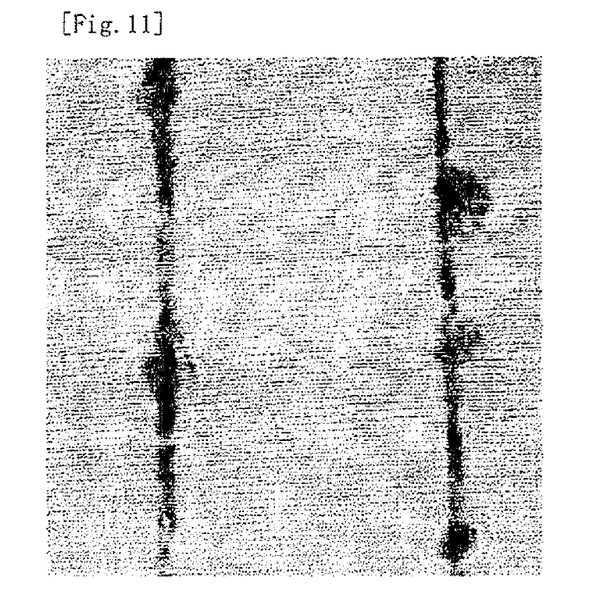
FIG. 11 is an electron micrograph of silver lines obtained by adding poly(vinylpyrrolidone) as the substance which blocks growth of metal crystal to a medium.

FIG. 2 shows an electron micrograph of a linear silver structure (silver line) formed of silver crystals formed on the substrate by the method of Example 1, and FIG. 3 shows an electron micrograph of a silver line formed on the substrate by the method of Comparative Example. FIG. 2 indicates that the formed silver line has a width of about 150 nm and that the particle of each silver crystal in the silver line has a nanometer size. On the other hand, FIG. 3 indicates that the silver line has a width of about 1 μm and that the surface is bumpy because of large rocky aggregates formed by growth of small particulate silver crystals. If such large aggregates are present, it is difficult to form a line with a smaller width by the method of Comparative Example, because the final line width depends on the sizes of the large particles.

Further it should be noted that, although the size of the laser focal point is about 1 μm, a silver line with a width about ten times smaller could be drawn by the method described in Example 1.

FIG. 2 indicates that the particle size of each silver crystal is very small compared with the width of the silver line, which suggests that it is possible to achieve finer processing if the spot size of the focal point of the laser beam is controlled to be smaller or if light is irradiated only to a smaller region.

Examples 2 to 8

The same experiments were performed using aqueous solution of silver nitrate, to which various substances according to the present invention (the following chemical formulae IX to XV) were added instead of NDSS used in Example 1, to thereby form silver lines. The silver lines thus formed are shown in FIGS. 4 to 11. Experimental conditions of respective examples are shown in Table 1. Processing was performed at room temperature.

Example 3

DL-alanine

Example 3

Sodium decanoate

Example 4

Disodium sebacate

Example 5

Sodium laurate

Example 6

DL-2-amino-n-octanoic acid

Example 7

Sodium N-lauroyl sarcosinate hydrate

Example 8

Poly(vinylpyrrolidone)

TABLE 1

Final concentration of substance which blocks growth of metal crystal, concentration of silver nitrate, laser intensity at focal point, and scan rate

| Example | Concentration of substance in medium | Concentration of silver nitrate | Intensity of irradiated laser beam | Scan rate |
| --- | --- | --- | --- | --- |
| 2 | 0.1M | 0.05M | 2.0 mW | 6 μm/s |
| 3 | 0.09M | 0.3M | 1.2 mW | 10 μm/s |
| 4 | 0.09M | 0.3M | 1.2 mW | 10 μm/s |
| 5 | 0.09M | 0.3M | 1.2 mW | 10 μm/s |
| 6 | 0.09M | 0.3M | 0.8 mW | 10 μm/s |
| 7 | 0.09M | 0.3M | 1.2 mW | 10 μm/s |
| 8 | 2 wt % | 0.05M | 1.6 mW | 6 μm/s |

In all the examples, the widths of the silver lines were in the range of 200 to 300 nm, which are very small compared with the size in the case of the comparative example. Meanwhile, also in the case where sodium sorbate was added as an unsaturated hydrocarbon, a line was formed. However, the metal ion was reduced directly by the sodium sorbate with time, which suggests that, in the case where a substance containing an unsaturated hydrocarbon is used, it was necessary to offset the reduction ability of the unsaturated hydrocarbon by, for example, adding an antioxidant immediately after processing, or previously adding an antioxidant to a material containing the metal ion.

Example 9

Formation of Three-Dimensional Structure

A metal structure having a three-dimensional structure was formed by the method of producing a metal structure of the present invention.

NDSS (Chemical formula V) was added to an aqueous solution of silver nitrate, and the solution was dropped on a glass substrate (Micro Cover Glass, manufactured by Matsunami Glass Ind., Ltd.). Laser beam (light source: Titanium: sapphire laser (Tsunami (registered trademark), manufactured by Spectra-Physics K.K.), center wavelength: 800 nm, pulse width: 80 fsec), which was controlled to be focused on the upper surface of the glass substrate (spot size of focal point is about 1 μm), was irradiated through the glass substrate from the bottom of the glass substrate, and the focal point was scanned linearly in a perpendicular direction to the surface of the substrate. The final concentration of NDSS was 0.1M, the concentration of silver nitrate was 0.04 M, the strength of the irradiated laser beam was 1.21 mW, and the scan rate was 2 μm/s (first round) and 4 μm/s (second round).

Figure 12:
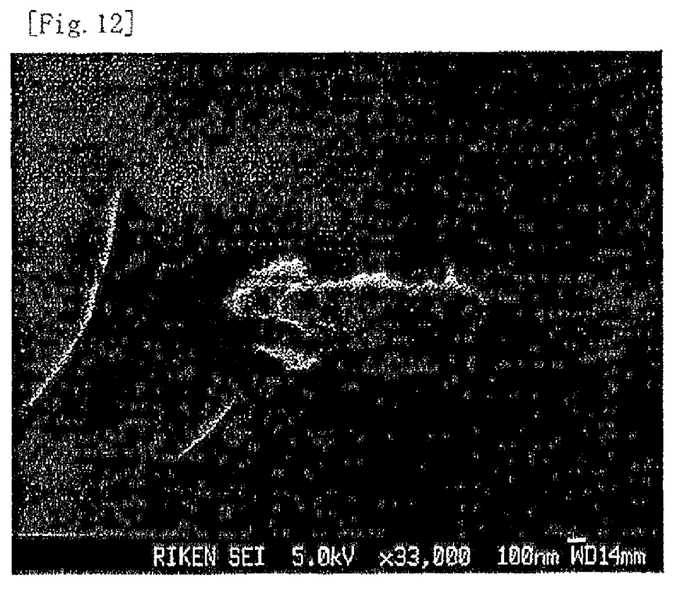
FIG. 12 is an electron micrograph of a silver rod formed by adding NDSS as the substance which blocks growth of metal crystal to a medium.
Figure 13:
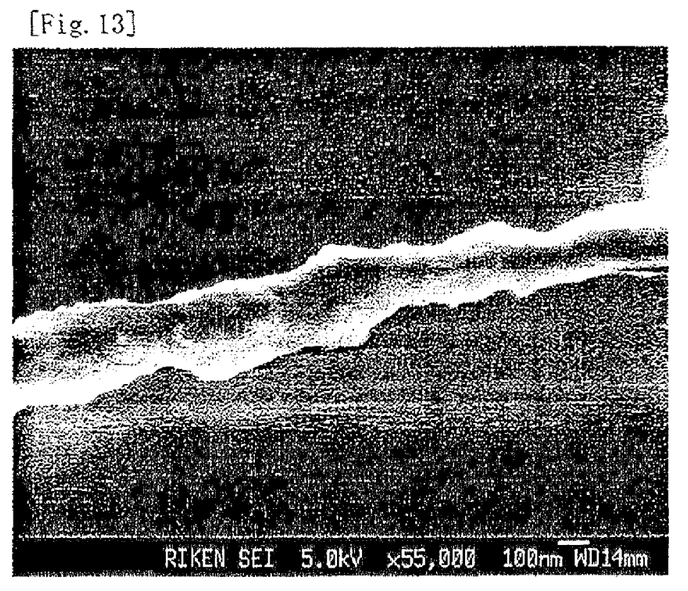
FIG. 13 is an electron micrograph of a silver rod formed by adding NDSS as the substance which blocks growth of metal crystal to a medium.

FIG. 12 shows an electron micrograph taken from obliquely above of a cylindrical silver structure (silver rod) which is formed of silver crystals formed on a substrate under the condition at the first round and stands upright on the substrate. This confirms that a silver rod having a cross section diameter of about 300 nm and having a smooth surface was formed. The magnified micrograph of a silver rod obtained by processing under the conditions at the second round (FIG. 13) shows that a silver rod with the finest width of about 100 nm was successfully processed.

The result demonstrated that, according to the present invention, a fine metal structure having a three-dimensional structure can be easily formed only by controlling the direction of light scanning.

INDUSTRIAL APPLICABILITY

According to the present invention, the particle size of metal crystal produced by photoreduction of metal ion can be controlled to a nanometer size, thereby the method significantly improves the processing resolution of a metal structure formed of the metal crystal. Therefore, an arbitrary pattern of fine and precise three-dimensional structure of a metal structure can be formed easily. The present invention can be used for manufacture of a micromachine, formation of a magnetic field in a microspace by forming of a small metal coil, or control of the refractive index.

While the invention has been described in detail with reference to preferred embodiments thereof, it will be apparent to one skilled in the art that various changes can be made, and equivalents employed, without departing from the scope of the invention. Each of the aforementioned documents including the priority application JP2008-077913 is incorporated by reference herein in its entirety.

What is claimed is:

1. A method of producing a metal structure composed of metal crystal, comprising a step of irradiating a medium containing metal ion dispersed therein with light, to thereby photoreduce the metal ion to produce metal crystal, wherein the medium contains a substance which blocks growth of the metal crystal, wherein the light is a femtosecond short pulse laser beam, and wherein the substance which blocks growth of the metal crystal is Sodium N-decanoyl sarcosinate (NDSS).

2. The method according to claim 1, wherein the metal ion is a silver ion.

3. The method according to claim 1, wherein the metal structure is a linear structure.

* * * * *